United States Patent
Koshiba (10) Patent No.: US 7,994,461 B2
(45) Date of Patent: Aug. 9, 2011

(54) SOLID-STATE IMAGING DEVICE AND IMAGING APPARATUS

(75) Inventor: Masaaki Koshiba, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 118 days.

(21) Appl. No.: 12/496,559

(22) Filed: Jul. 1, 2009

(65) Prior Publication Data

US 2010/0001178 A1 Jan. 7, 2010

(30) Foreign Application Priority Data

Jul. 1, 2008 (JP) ................................. 2008-172306
May 19, 2009 (JP) ................................. 2009-120559

(51) Int. Cl.
*H01L 27/14* (2006.01)
*H04N 5/335* (2011.01)

(52) U.S. Cl. ...................... 250/208.1; 257/435; 257/446

(58) Field of Classification Search ................ 250/208.1; 257/431, 435, 446
See application file for complete search history.

(56) References Cited

U.S. PATENT DOCUMENTS

| | | | | |
|---|---|---|---|---|
| 5,076,670 | A * | 12/1991 | Sayyah | 349/27 |
| 6,690,049 | B2 * | 2/2004 | Suzuki et al. | 257/294 |
| 7,139,057 | B2 * | 11/2006 | Lee | 349/139 |
| 2002/0195628 | A1 | 12/2002 | Yamada | |
| 2004/0212751 | A1 * | 10/2004 | Lee | 349/42 |
| 2007/0099371 | A1 * | 5/2007 | Jeon | 438/199 |
| 2009/0065815 | A1 | 3/2009 | Naya | |
| 2009/0189236 | A1 * | 7/2009 | Hayashi et al. | 257/432 |
| 2010/0001178 | A1 * | 1/2010 | Koshiba | 250/237 R |
| 2010/0045908 | A1 * | 2/2010 | Woo | 349/116 |
| 2010/0301483 | A1 * | 12/2010 | Gaebler | 257/758 |

FOREIGN PATENT DOCUMENTS

| | | |
|---|---|---|
| JP | 2003-037262 A | 2/2003 |
| JP | 2005-109021 A | 4/2005 |
| JP | 2009-070912 A | 4/2009 |
| JP | 2009-070913 A | 4/2009 |

* cited by examiner

*Primary Examiner* — John R Lee
(74) *Attorney, Agent, or Firm* — Kimble Intellectual Property Law, PLLC (57) ABSTRACT

A solid-state imaging device includes: an effective pixel region where photoelectric converting portions for obtaining an imaging signal corresponding to light from an object are disposed; an OB pixel region having an element region for obtaining a reference signal of an optical black level; a first light blocking layer which is disposed on the effective pixel region, and in which openings are provided above the photoelectric converting portions; and a second light blocking layer which is disposed on the OB pixel region, the first light blocking layer and the second light blocking layer are electrically isolated from each other by an isolating region, and the imaging device further includes a light blocking section for blocking light from entering the isolating region is provided.

13 Claims, 6 Drawing Sheets

SOLID-STATE IMAGING DEVICE AND IMAGING APPARATUS

CROSS-REFERENCE TO RELATED APPLICATIONS

This application claims the benefit of Japanese Patent Application JP 2008-172306, filed Jul. 1, 2008, and Japanese Patent Application JP 2009-120559, filed May 19, 2009, the entire contents of which are hereby incorporated by reference, the same as if set forth at length.

FIELD OF THE INVENTION

The present invention relates to a solid-state imaging device having: an effective pixel region where photoelectric converting portions for producing an imaging signal in accordance with incident light are arranged; and an OB pixel region where optical black portions (OB portions) for obtaining a reference signal which is optically black are arranged, and also to an imaging apparatus.

BACKGROUND OF THE INVENTION

A solid-state imaging device includes a pixel region which has: a plurality of photoelectric converting portions configured by photodiodes that are arranged on a semiconductor substrate; and charge transfer electrodes for transferring signal charges that are read-out from the photoelectric converting portions, and in which a light blocking layer that is opened above the photoelectric converting portions to allow incident light to pass therethrough, and that blocks light from entering the charge transfer electrodes.

In a conventional solid-state imaging device, a configuration has been proposed in which a voltage is applied to a light blocking layer in order to lower the read-out voltage and improve the smear characteristics.

JP-A-2003-37262 discloses a configuration of a solid-state imaging device including in a semiconductor substrate: a photoelectric converting region; a transfer channel region; a transfer electrode which is formed on the transfer channel region through a gate insulating film; and an electrically conductive light blocking layer which has an opening above the photoelectric converting region.

JP-A-2005-109021 discloses a configuration of a solid-state imaging device in which, in an imaging region where a light receiving sensor portion and a vertical transfer register are formed, a region excluding the light receiving sensor portion is covered by a light blocking layer, and the light blocking layer functions also as a read-out electrode for reading out a signal charge accumulated in the light receiving sensor portion to the vertical transfer register.

SUMMARY OF THE INVENTION

In the pixel region of the solid-state imaging device, an effective pixel region which is a region where photoelectric converting portions for producing a signal charge in accordance with incident light from an object to actually obtain an imaging signal, and an OB pixel region for obtaining a reference signal of the optical black level are formed.

A voltage is applied to the light blocking layer on the effective pixel region. This is performed in order to lower the read-out voltage of a pixel portion of the effective pixel region.

In the configurations of JP-A-2003-37262 and JP-A-2005-109021, it is assumed that the light blocking layers of the effective pixel region and the OB pixel region are integrally formed and electrically connected to each other. At the same time when a voltage is applied to the effective pixel region, the same voltage is applied also to the OB pixel region. Then, the accuracy of the reference signal obtained from the OB pixel region is lowered, with the result that the imaging signal cannot be clamped to a stable reference level and a satisfactory image cannot be sometimes obtained.

Furthermore, it is found that, when a voltage is applied to both the light blocking layers of the effective pixel region and the OB pixel region, so-called black sinking, i.e., a phenomenon in which the dark current of the OB pixel region is increased more largely than that of the effective pixel region, and the output of the pixel portion of the effective pixel region sinks. This is caused because of the following reason. Openings are disposed in the light blocking layer on the effective pixel region, but the whole face of the OB pixel region is covered by the light blocking layer. Therefore, the bias effect is increased in the OB pixel region, and the dark current of a vertical charge transfer channel located in the OB pixel region is increased more than that in the effective pixel region, whereby the clamping operation is caused not to be normally performed.

The invention has been conducted in view of the above-described circumstances. It is an object of the invention to provide a solid-state imaging device and imaging apparatus in which the read-out voltage and increase of smear can be suppressed, and a stable reference signal can be obtained from an OB pixel region.

The object of the invention can be attained by the following configurations.

(1) A solid-state imaging device wherein the imaging device includes:

an effective pixel region where photoelectric converting portions for obtaining an imaging signal corresponding to light from an object are disposed;

an OB pixel region having an element region for obtaining a reference signal of an optical black level;

a first light blocking layer which is disposed on the effective pixel region, and in which openings are formed above the photoelectric converting portions; and a second light blocking layer which is disposed on the OB pixel region, the first light blocking layer and the second light blocking layer are electrically isolated from each other by an isolating region, and a light blocking section for blocking light from entering the isolating region is formed.

(2) In the solid-state imaging device of (1) above, a voltage is applied to only the first light blocking layer.

(3) In the solid-state imaging device of (1) above, a terminal for applying a first voltage is connected to the first light blocking layer, and a terminal for applying a second voltage which is different from the first voltage is connected to the second light blocking layer.

(4) In the solid-state imaging device of any one of (1) to (3) above, the light blocking section is a third light blocking layer which is formed above the isolating region.

(5) In the solid-state imaging device of (4) above, the third light blocking layer covers the isolating region, and is formed in a region which is wider than the isolating region.

(6) In the solid-state imaging device of any one of (1) to (3) above, the light blocking section is an optical layer which is formed above the isolating region, and which is optically black.

(7) A solid-state imaging device wherein the imaging device includes:

an effective pixel region where photoelectric converting portions for obtaining an imaging signal corresponding to light from an object are disposed;

an OB pixel region having an element region for obtaining a reference signal of an optical black level;

a first light blocking layer which is disposed on the effective pixel region, and in which openings are formed above the photoelectric converting portions; and a second light blocking layer which is disposed on the OB pixel region, the first light blocking layer and the second light blocking layer are electrically isolated from each other by an isolating region, and a voltage is applied to only the first light blocking layer.

(8) A solid-state imaging device wherein the imaging device includes:

an effective pixel region where photoelectric converting portions for obtaining an imaging signal corresponding to light from an object are disposed;

an OB pixel region having an element region for obtaining a reference signal of an optical black level;

a first light blocking layer which is disposed on the effective pixel region, and in which openings are formed above the photoelectric converting portions; and a second light blocking layer which is disposed on the OB pixel region, a terminal for applying a first voltage is connected to the first light blocking layer, and a terminal for applying a second voltage which is different from the first voltage is connected to the second light blocking layer.

(9) In the solid-state imaging device of (7) or (8) above, a light blocking section for blocking light from entering the isolating region is formed.

(10) In the solid-state imaging device of any one of (7) to (9) above, the light blocking section is a third light blocking layer which is formed above the isolating region.

(11) In the solid-state imaging device of (10) above, the third light blocking layer covers the isolating region, and is formed in a region which is wider than the isolating region.

(12) In the solid-state imaging device of any one of (7) to (9) above, the light blocking section is an optical layer which is formed above the isolating region, and which is optically black.

(13) An imaging apparatus including a solid-state imaging device of any one of (1) to (12) above.

The solid-state imaging device of the invention has the configuration which includes the effective pixel region and the OB pixel region, which has the first light blocking layer disposed on the effective pixel region, and the second light blocking layer disposed on the OB pixel region, and in which the first light blocking layer and the second light blocking layer are electrically isolated from each other by forming the isolating region therebetween. Even when a voltage is applied to the effective pixel region, therefore, the voltage is not applied to the OB pixel region. According to the configuration, a voltage can be applied to only the effective pixel region without affecting the OB pixel region, whereby smear and rising of the read-out voltage can be suppressed. Furthermore, it is possible to prevent a difference between the dark current caused in a pixel portion of the OB pixel region and that caused in a pixel portion of the effective pixel region from being produced. Therefore, black sinking can be prevented from occurring in the pixel portion of the effective pixel region. Moreover, the solid-state imaging device of the invention has the configuration where the light blocking section is formed above the isolating region. Therefore, light which passes between the first and second light blocking layers, and which is to be incident on the surface of the semiconductor substrate can be blocked by the light blocking section, so that stray light can be prevented from leaking into the OB pixel region. Consequently, a stable reference signal can be obtained from the OB pixel region.

Preferably, the solid-state imaging device is configured so that the light blocking section is the third light blocking layer, and the third light blocking layer covers the isolating region, and is formed in a region which is wider than the isolating region. According to the configuration, in the case where the OB pixel region is formed not in the whole face of the device region but in a peripheral end portion, a light component which is incident obliquely with respect to the direction perpendicular to the surface of the semiconductor substrate is increased, but, when the third light blocking layer is formed in the region which is wider than the isolating region, the phenomenon that stray light enters the OB pixel region can be prevented more surely from occurring.

According to the invention, it is possible to provide a solid-state imaging device and imaging apparatus in which the read-out voltage and increase of smear can be suppressed, and a stable reference signal can be obtained from an OB pixel region.

DETAILED DESCRIPTION OF THE INVENTION

Hereinafter, embodiments of the invention will be described in detail with reference to the accompanying drawings.

Figure 1:
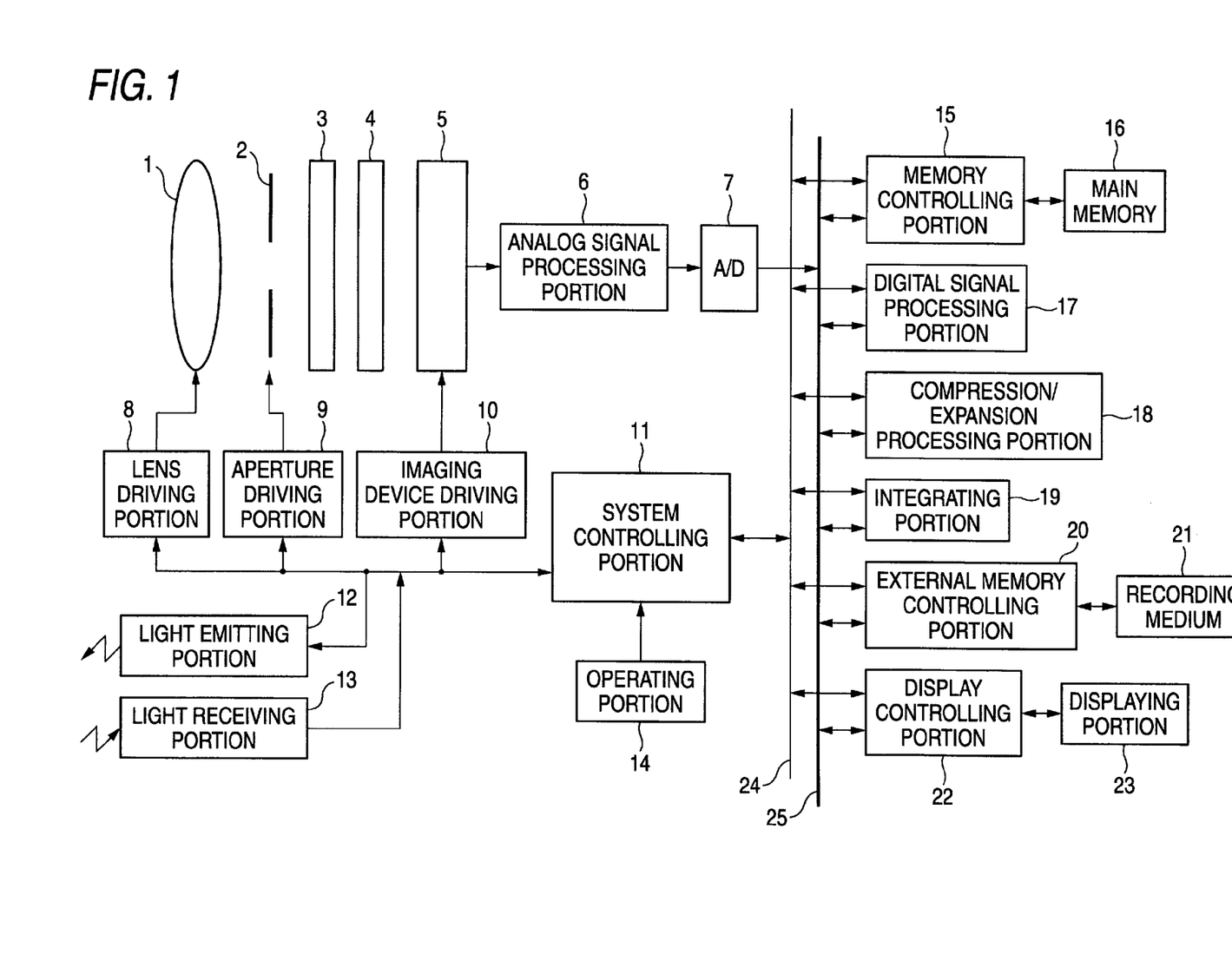
FIG. 1 is a diagram schematically showing the configuration of an imaging apparatus including the solid-state imaging device of the invention.

FIG. 1 is a diagram schematically showing the configuration of an imaging apparatus including the solid-state imaging device of the invention. Examples of an imaging apparatus including a solid-state imaging device are a digital camera and a digital video camera. The embodiment will be described by exemplifying a digital camera.

As shown in FIG. 1, the imaging apparatus includes an imaging lens 1, a solid-state imaging device 5, an aperture 2 disposed between the imaging lens 1 and the solid-state imaging device 5, an infrared blocking filter 3, and an optical low-pass filter 4.

The imaging apparatus further includes a system controlling portion 11 which controls the whole electric control system. The system controlling portion 11 controls a light emitting portion 12 for a flash lamp and a light receiving portion 13, controls a lens driving portion 8 to adjust the position of the imaging lens 1 to the focusing position, or to perform the zoom adjustment, and controls the opening degree of the aperture 2 through an aperture driving portion 9 to adjust the exposure amount. The system controlling portion 11 drives the solid-state imaging device 5 through an imaging device driving portion 10 so as to output an object image taken through the imaging lens 1, as a color signal. The system controlling portion 11 receives a signal indicative of instructions from the user through an operating portion 14.

The imaging apparatus includes an analog signal processing portion 6 which is connected to the solid-state imaging device 5, and which processes in an analog manner the signal output from the solid-state imaging device 5, and an A/D converting circuit 7 which converts R, G, and B color signals output from the analog signal processing portion 6 to respective digital signals. The analog signal processing portion 6 and the A/D converting circuit 7 are controlled by the system controlling portion 11.

The imaging apparatus further includes: a main memory 16; a memory controlling portion 15 which is connected to the main memory 16; a digital signal processing portion 17 for performing an interpolation calculation, the gamma correction, the RGB/YC converting process, and the like to produce image data; a compression/expansion processing portion 18 which compresses the image data produced by the digital signal processing portion 17 to JPEG format data and expands compressed image data; an integrating portion 19 which integrates photometric data to adjust the gain of a white balance correction performed by the digital signal processing portion 17; an external memory controlling portion 20 to which a detachable recording medium 21 is to be connected; and a display controlling portion 22 to which a liquid crystal displaying portion 23 mounted on, for example, the back face of the camera is connected. These portions are interconnected by a control bus 24 and a data bus 25, and controlled by instructions from the system controlling portion 11.

Figure 2:
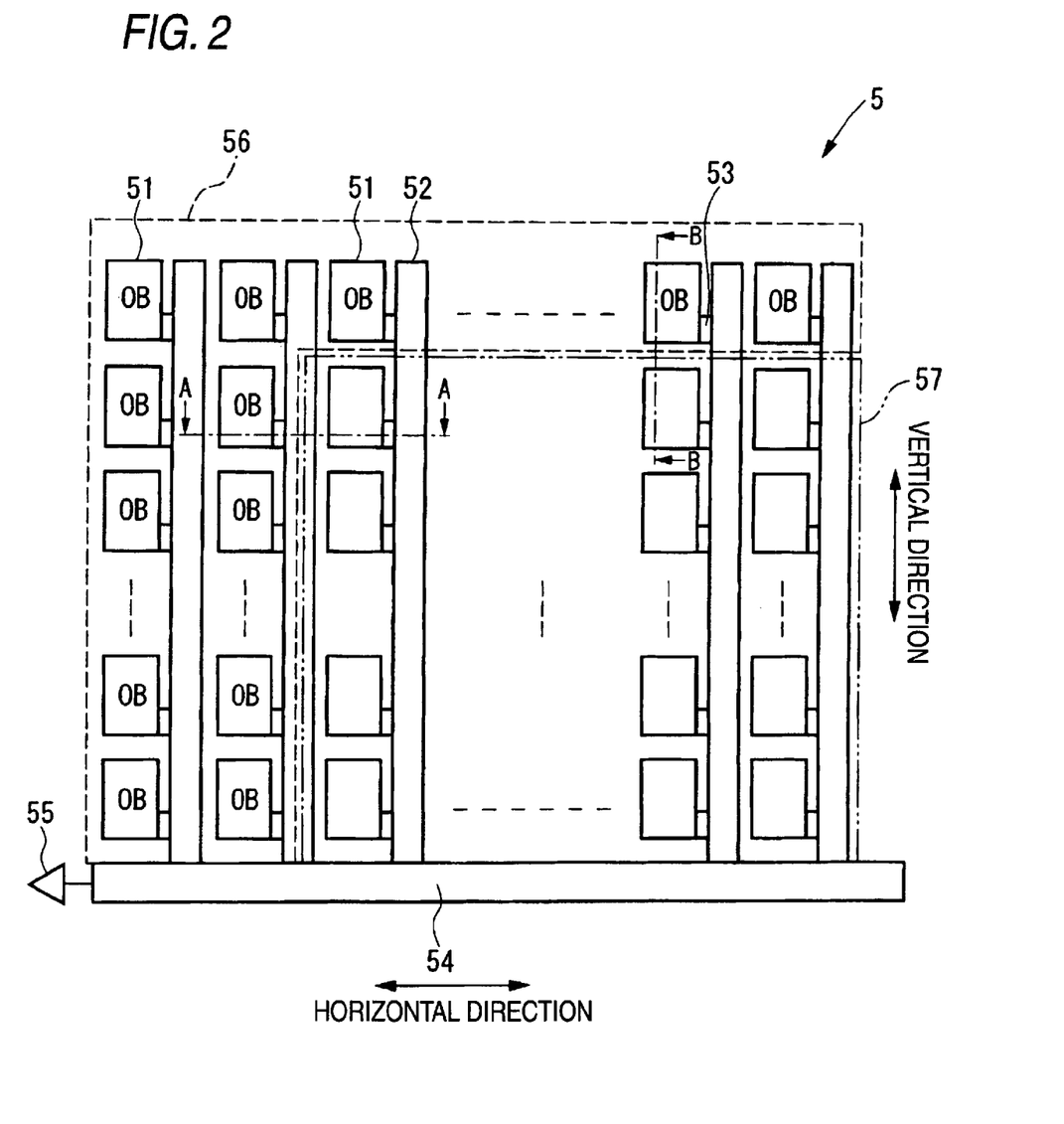
FIG. 2 is a plan view schematically showing the solid-state imaging device.

Next, the configuration of a first embodiment of the solid-state imaging device of the invention will be described. FIG. 2 is a plan view schematically showing the solid-state imaging device.

In the solid-state imaging device 5, as shown in FIG. 2, a plurality of photoelectric converting portions 51 each configured by a photodiode or the like are arranged in a square lattice pattern in the vertical direction of the semiconductor substrate and a horizontal direction perpendicular to the vertical direction. In the semiconductor substrate, on the right side of each column of photoelectric converting portions 51 which are vertically arranged, a vertical charge transfer path 52 for vertically transferring signal charges read-out from the photoelectric converting portions is disposed. The semiconductor substrate includes: charge reading-out portions 53 for reading out signal charges accumulated in the photoelectric converting portions 51 to the respective vertical charge transfer paths 52; a horizontal charge transfer path 54 for horizontally transferring charges which have been transferred through the respective vertical charge transfer paths 52; and an outputting portion 55 which converts charges transferred through the horizontal charge transfer path 54, to voltage signals, and outputs the signals. The embodiment will be described by exemplifying a so-called Bayer arrangement in which the photoelectric converting portions 51 are arranged in a substantially square lattice pattern in the surface of the semiconductor substrate. The arrangement of the photoelectric converting portions is not restricted to this. Each column of the photoelectric converting portions 51 may be vertically shifted by ½ pitch with respect to the adjacent columns.

The solid-state imaging device includes: an effective pixel region 57 in which photoelectric converting portions 51 for producing a signal charge by the photoelectric converting function in accordance with light supplied from the object, to obtain an image signal that is to be actually used are disposed; and an OB pixel region 56 which is an element region where photoelectric converting portions 51 for obtaining a reference signal for the optical black level are disposed. In FIG. 2, the photoelectric converting portions 51 for obtaining the reference signal for the optical black level are indicated by "OB". In the solid-state imaging device 5 of the embodiment, the region where the photoelectric converting portions 51 for obtaining an imaging signal corresponding to light supplied from the object is called the effective pixel region 57, and that where the photoelectric converting portions 51 for obtaining the reference signal for the optical black level are disposed is called the OB pixel region 56. In the embodiment, as shown in FIG. 2, the photoelectric converting portions 51 of the OB pixel region 56 are disposed in one vertical side and one horizontal side of the effective pixel region 57. However, the manner of the arrangement of the photoelectric converting portions 51 of the OB pixel region 56 is not restricted to this. The photoelectric converting portions may be disposed in other positions in the periphery of the effective pixel region 57. Alternatively, the element region of the OB pixel region 56 may be formed as a region where the photoelectric converting portions 51 are not disposed, and simply charge transfer electrodes 58 for transferring charges which will function as the reference signal are formed.

Figure 3:
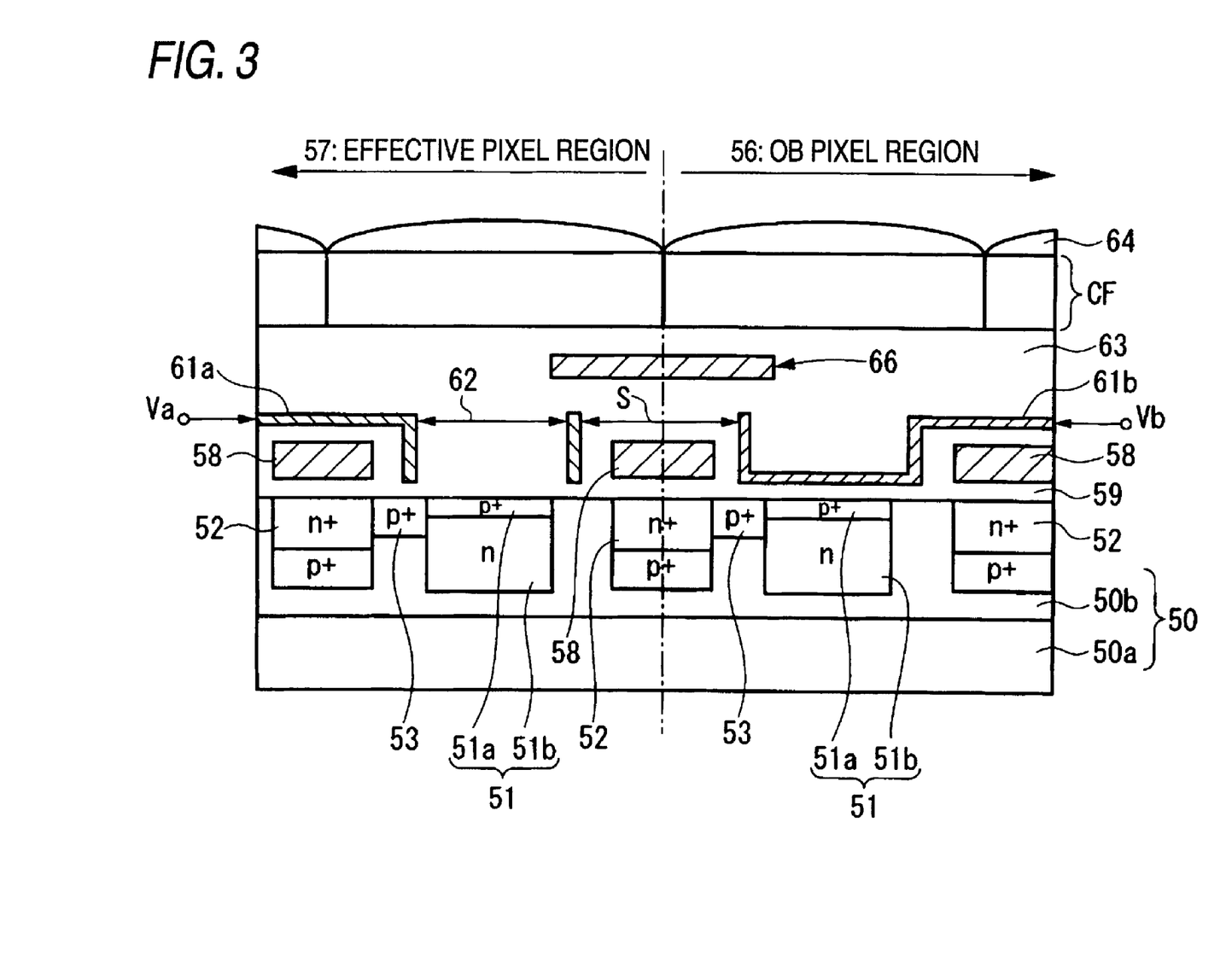
FIG. 3 is a sectional view taken along line A-A of the solid-state imaging device shown in FIG. 2.

FIG. 3 is a sectional view taken along line A-A of the solid-state imaging device shown in FIG. 2.

The solid-state imaging device includes the semiconductor substrate 50. The semiconductor substrate 50 is configured by an n-type substrate 50a, and a p-well layer 50b which is formed in the light incident surface of the n-type substrate 50a. Pixel regions including the photoelectric converting portions 51 are formed in the surface of the p-well layer 50b of the semiconductor substrate 50.

Each of the photoelectric converting portions 51 is configured by a p-type impurity layer 51a which is formed in the light incident surface of the p-well layer 50b, and an n-type impurity layer 51b which is formed below the p-type impurity layer 51a. The p-type impurity layer 51a has a function of fixing the surface potential of the photoelectric converting portion 51 to prevent the dark current from occurring. The signal charge which is generated in the photoelectric converting portion 51 is accumulated into the n-type impurity layer 51b.

In the semiconductor substrate 50, the vertical charge transfer path 52 configured by an n-type impurity layer is formed on the left side of and slightly separated from the photoelectric converting portion 51. In order to read out the signal charge accumulated in the n-type impurity layer 51b of the photoelectric converting portion 51, to the vertical charge transfer path 52, the charge reading-out portion 53 configured by a p-type impurity is formed between the photoelectric converting portion 51 and the vertical charge transfer path 52.

In the semiconductor substrate 50, a gate insulating film which is configured by a silicon oxide film or an ONO film, and which is not shown is formed above the photoelectric converting portion 51, the vertical charge transfer path 52, and the charge reading-out portion 53. An electrode 58 which is made of polysilicon or the like, and which is used for supplying a voltage to the vertical charge transfer path 52 through the gate insulating film to control the charge transferring operation is formed above the semiconductor substrate 50.

An insulating film 59 is formed so as to cover the gate insulating film and the electrode 58, and a first light blocking layer 61a and second light blocking layer 61b which are made of aluminum or tungsten are formed on the insulating film 59. The first light blocking layer 61a is formed on the effective pixel region 57, and, above the photoelectric converting portion 51, has an opening 62 which allows incident light to enter the photoelectric converting portion 51. The second light blocking layer 61b is formed on the OB pixel region 56. In the embodiment, the first light blocking layer 61a and the second light blocking layer 61b are electrically isolated from each other. An insulative transparent layer 63 is disposed on the first light blocking layer 61a and the second light blocking layer 61b, a color filter layer CF is formed on the transparent layer 63, and a microlens 64 is formed on the color filter layer.

An isolating region S which electrically isolates the first light blocking layer 61a from the second light blocking layer 61b is disposed therebetween. The isolating region S is a region that, when viewed in a plan view from the side in which light is incident on the semiconductor substrate 50, is formed between the first light blocking layer 61a and the second light blocking layer 61b, and that is not electrically conductive with both the first light blocking layer 61a and the second light blocking layer 61b. Voltages can be independently applied to the first light blocking layer 61a and the second light blocking layer 61b, respectively. In FIG. 3, a terminal to which a voltage Va can be applied is connected to the first light blocking layer 61a, and a terminal to which a voltage Vb can be applied is connected to the second light blocking layer 61b.

Alternatively, only the first light blocking layer 61a may be connected to a terminal to which the voltage Va can be applied. According to the configuration, during driving of the solid-state imaging device, when the predetermined voltage Va is applied to the first light blocking layer 61a on the effective pixel region 57, the voltage is applied to only the first light blocking layer 61a, and not applied to the second light blocking layer 61b.

In the transparent layer 63, a third light blocking layer 66 which functions as a light blocking section is formed above the isolating region S. The third light blocking layer 66 may be made of the same material as the first light blocking layer 61a and the second light blocking layer 61b, and formed by using an electrically conductive light blocking layer made of, for example, aluminum or tungsten. In an example of the procedure of forming the transparent layer 63, the transparent layer 63 is formed to a certain thickness on the first light blocking layer 61a and the second light blocking layer 61b, an electrically conductive light blocking material layer constituting the third light blocking layer 66 is formed, exposure and development are conducted by the photolithography process while masking a portion of the light blocking material layer other than that existing above the isolating region S, and an etching process is conducted, whereby the third light blocking layer 66 can be formed. Thereafter, the transparent layer 63 is further formed so as to cover the third light blocking layer 66, and the color filter layer CF and the microlens 64 are formed, so that the solid-state imaging device of the embodiment can be obtained.

Preferably, the embodiment is configured so that the third light blocking layer 66 covers the isolating region S, and is formed in a region which is wider than the isolating region S. According to the configuration, in the case where the OB pixel region 56 is formed not in the whole face of the device region but in a peripheral end portion, a light component which is incident obliquely with respect to the direction perpendicular to the surface of the semiconductor substrate 50 is increased, but, when the third light blocking layer 66 is formed in the region which is wider than the isolating region S, the phenomenon that stray light enters the OB pixel region 56 can be prevented more surely from occurring.

The solid-state imaging device of the invention has the configuration which includes the effective pixel region 57 and the OB pixel region 56, which has the first light blocking layer 61a disposed on the effective pixel region 57, and the second light blocking layer 61b disposed on the OB pixel region 56, and in which the first light blocking layer 61a and the second light blocking layer 61b are electrically isolated from each other by forming the isolating region S therebetween. Even when a voltage is applied to the first light blocking layer 61a, therefore, the second light blocking layer 61b on the side of the OB pixel region 56 is not affected, and smear and rising of the read-out voltage can be suppressed. Furthermore, it is possible to prevent the dark current from occurring in the OB pixel region, and black sinking can be prevented from occurring in the pixel portion of the effective pixel region. Moreover, the embodiment has the configuration where the third light blocking layer 66 functioning as a light blocking section is formed above the isolating region S. Therefore, light which passes between the first light blocking layer 61a and the second light blocking layer 61b, and which is to be incident on the surface of the semiconductor substrate 50 can be blocked by the third light blocking layer 66, so that stray light can be prevented from leaking into the OB pixel region 56. Consequently, the stable reference signal can be obtained from the OB pixel region 56.

Voltages of different levels may be applied to the first light blocking layer 61a of the effective pixel region 57 and the second light blocking layer 61b of the OB pixel region 56, respectively. When the voltage Va to be applied to the first light blocking layer 61a is referred as a first voltage, and the voltage Vb to be applied to the second light blocking layer 61b is referred as a second voltage, the second voltage Vb is made lower than the first voltage Va. The level relationship of the first and second voltages is not restricted to this. The first and second voltages are requested to be different from each other. According to the configuration, the bias effect in the OB pixel region 56 is made smaller than that in the effective pixel region 57, and black sinking in the pixel portion of the effective pixel region 57 can be prevented more surely from occurring.

With respect to the timing of applying the first and second voltages, during a period when the solid-state imaging device is driven, the first and second voltages of respective constant levels may be applied as a bias voltage. This attains an effect that the read-out voltage can be lowered.

By contrast, when charges are to be read out from the photoelectric converting portion to the vertical charge transfer path, during a period including that when a read-out pulse is applied from a timing generator, the first and second voltages may be applied in the form of a pulse. According to the configuration, the read-out voltage can be lowered. In the period other than the above-described one, the voltages may be set to 0 V which is at the ground (GND) level and the reference voltage, or a minus voltage may be applied. According to the configuration, smear can be reduced. The pulse widths of the first and second voltages can be adjusted in accordance with the characteristics. In the case where the first and second voltages are applied in the form of a pulse, the second voltage may have a value higher than the first voltage. For example, the voltage to be applied to the pixel portion of the effective pixel region 57 may be set to −7.0 V, and that to be applied to the pixel portion of the OB pixel region 56 may be set to −6.5 V.

Figure 4:
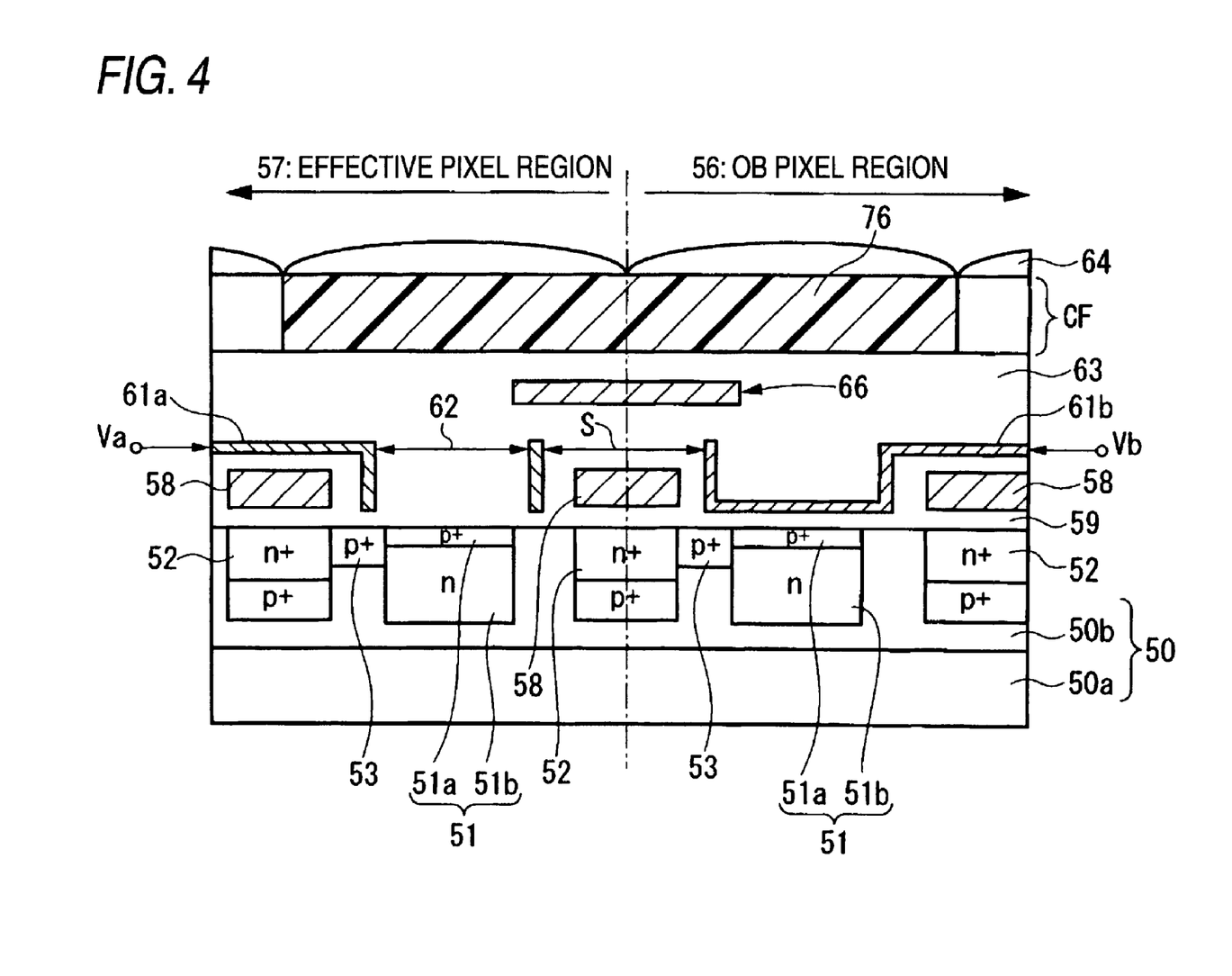
FIG. 4 is a sectional view showing the configuration of a solid-state imaging device of a second embodiment.

Next, the configuration of a second embodiment of the solid-state imaging device of the invention will be described. FIG. 4 is a sectional view showing the configuration of the solid-state imaging device of the second embodiment. In a similar manner as FIG. 3, FIG. 4 shows the state where the same section as that of the sectional view taken along line A-A of the solid-state imaging device shown in FIG. 2 is viewed. In the following description of the embodiment, members and the like which are equivalent in configuration and function to those described above are denoted by the same or corresponding reference numerals in the figure, and their description is simplified or omitted.

Basically, the solid-state imaging device of the embodiment is identical in configuration with that of the above-described first embodiment. The first light blocking layer 61a and the second light blocking layer 61b are electrically isolated from each other by the isolating region S which is disposed therebetween, and the voltage Va can be applied to only the first light blocking layer 61a. Alternatively, the voltages Va, Vb of different levels may be applied to the first light blocking layer 61a and the second light blocking layer 61b, respectively. In the alternative, the second voltage Vb is made lower than the first voltage Va. In contrast to the configuration of the solid-state imaging device of the first embodiment where the third light blocking layer 66 which functions as a light blocking section is disposed in the transparent layer 63, the solid-state imaging device of the embodiment is configured so that an optical layer 76 which is optically black is formed in a portion that is in the color filter layer CF, and that is above the isolating region S, and the optical layer 76 functions as a light blocking section. The optical layer 76 absorbs or reflects light which is incident on the side of the surface of the semiconductor substrate, whereby the lower isolating region S is irradiated with light and stray light can be prevented from entering the OB pixel region 56.

As the optical layer 76 which is optically black, for example, s black (NSBK series, BKISK series) which is a black resist ink produced by Nippon Steel Chemical Co., Ltd., or CFPR BK series which is a black resist produced by TOKYO OHKA KOGYO CO., LTD. may be used.

Next, an example of the procedure of forming the optical layer will be described with reference to the drawings. FIGS. 5A to 6B are views showing the procedure of forming the optical layer.

Figure 5A:
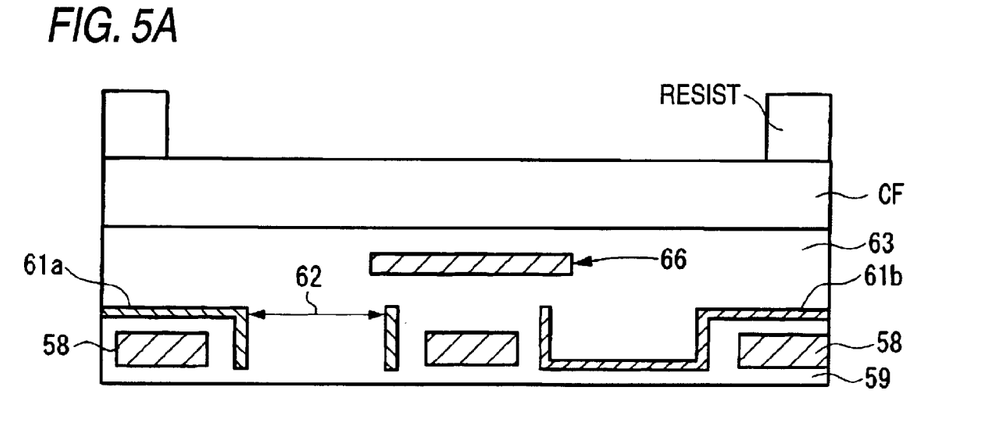
FIGS. 5A, 5B, and 5C are views showing a procedure of forming an optical layer.
Figure 5B:
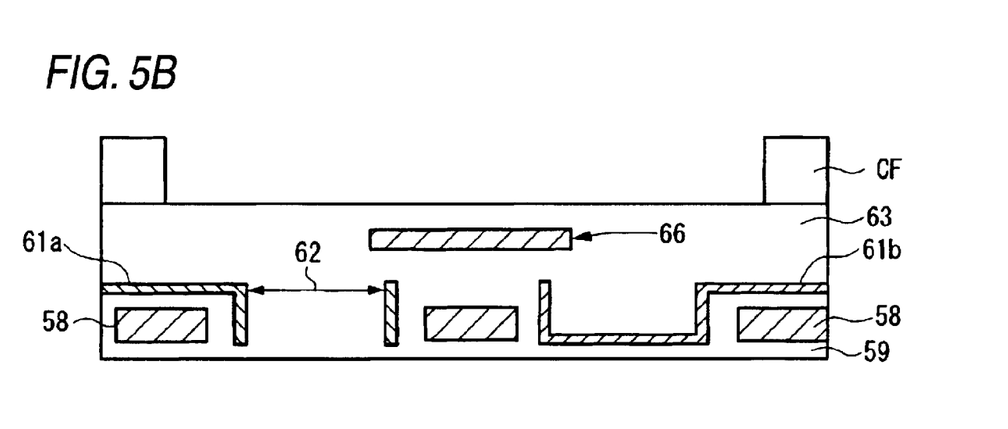
Figure 5C:
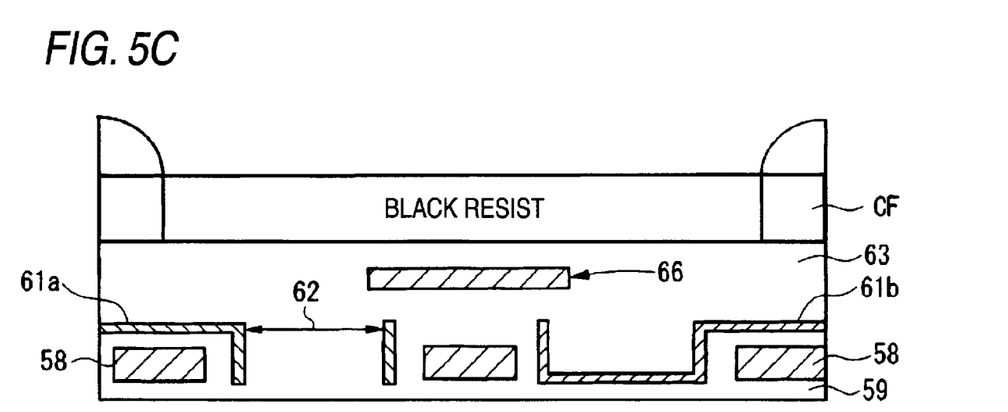

As shown in FIG. 5A, as described above, after the layers up to the transparent layer 63 are formed on the semiconductor substrate, a color resist layer for constituting the color filter layer CF is formed on the transparent layer 63. Then, a resist is applied, and patterning is performed. As shown in FIG. 5B, thereafter, the resist is exposed to light, and a developing process is conducted. In the case where a positive resist is used, the exposed portion becomes soluble, and is removed away by the developing process. As shown in FIG. 5C, next, a black resist is applied so as to cover the whole upper faces of the transparent layer 63 and the color filter layer CF.

Figure 6A:
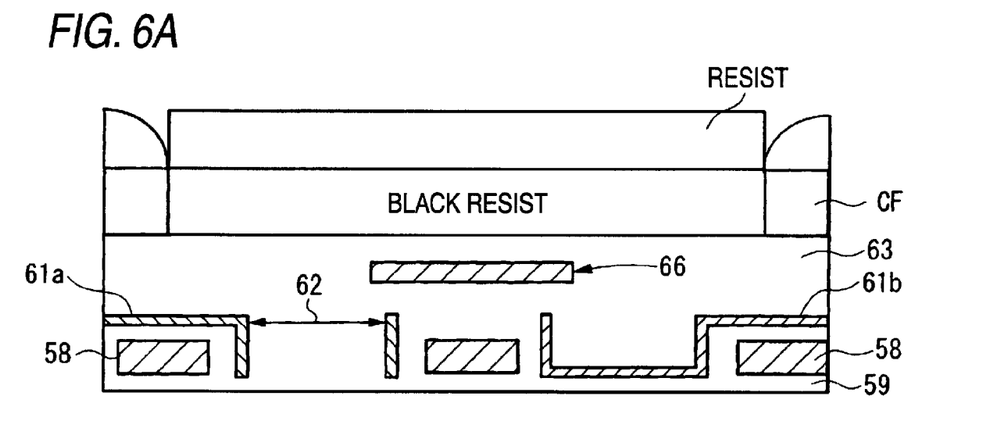
FIGS. 6A and 6B are views showing the procedure of forming the optical layer.
Figure 6B:
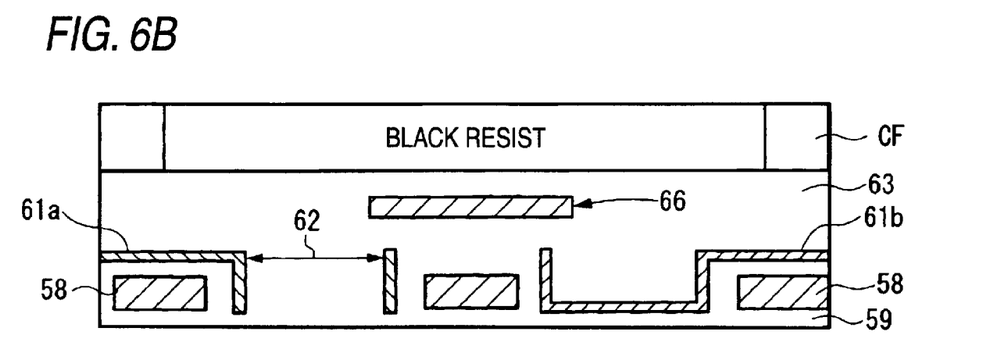

After the black resist is applied, as shown in FIG. 6A, a resist pattern is formed on a portion of the isolating region S. As shown in FIG. 6B, then, the resist is exposed to light, and a developing process is conducted, thereby removing the black resist remaining on the color filter layer CF. As a result, the optical layer which is made of the black resist, and which is optically black can be formed on the isolating region S.

According to the solid-state imaging device of the embodiment, the first light blocking layer 61a and the second light blocking layer 61b are electrically isolated from each other, and a voltage can be applied to only the first light blocking layer 61a on the effective pixel region 57. Therefore, smear and rising of the read-out voltage can be suppressed in the effective pixel region 57. Alternatively, voltages of different levels may be applied to the first light blocking layer 61a and the second light blocking layer 61b, respectively. In the alternative, the second voltage Vb is made lower than the first voltage Va. The embodiment has the configuration where the optical layer 76 functioning as a light blocking section is formed above the isolating region S. Therefore, light which passes between the first light blocking layer 61a and the second light blocking layer 61b, and which is to be incident on the surface of the semiconductor substrate 50 can be blocked by optical layer 76, so that stray light can be prevented from leaking into the OB pixel region 56. Consequently, a stable reference signal can be obtained from the OB pixel region 56.

Although the solid-state imaging device of the embodiment is configured so as to include the black resist and the third light blocking layer 66, the solid-state imaging device of the invention may be configured so as not to include the third light blocking layer 66.

The invention is not restricted to the above-described embodiments, and adequate modifications, improvements, and the like are possible.

In the embodiments, for example, the solid-state imaging device has been described with exemplifying the configuration of a CCD image sensor. However, the solid-state imaging device of the invention is not restricted to this. For example, the solid-state imaging device may be an imaging device which has the same problems, and which has another structure.

What is claimed is:

1. A solid-state imaging device comprising:
   an effective pixel region where photoelectric converting portions for obtaining an imaging signal corresponding to light from an object are disposed;
   an OB pixel region having an element region for obtaining a reference signal of an optical black level;
   a first light blocking layer which is disposed on said effective pixel region, and in which openings are provided above said photoelectric converting portions; and
   a second light blocking layer which is disposed on said OB pixel region, wherein said first light blocking layer and said second light blocking layer are electrically isolated from each other by an isolating region, and the imaging device further comprises a light blocking section for blocking light from entering said isolating region is provided.

2. The solid-state imaging device according to claim 1, wherein a voltage is applied to only said first light blocking layer.

3. The solid-state imaging device according to claim 1, wherein a terminal for applying a first voltage is connected to said first light blocking layer, and a terminal for applying a second voltage which is different from the first voltage is connected to said second light blocking layer.

4. The solid-state imaging device according to claim 1, wherein said light blocking section is a third light blocking layer which is provided above said isolating region.

5. The solid-state imaging device according to claim 4, wherein said third light blocking layer covers said isolating region, and is provided in a region which is wider than said isolating region.

6. The solid-state imaging device according to claim 1, wherein said light blocking section is an optical layer which is provided above said isolating region, and which is optically black.

7. A solid-state imaging device comprising:
   an effective pixel region where photoelectric converting portions for obtaining an imaging signal corresponding to light from an object are disposed;
   an OB pixel region having an element region for obtaining a reference signal of an optical black level;
   a first light blocking layer which is disposed on said effective pixel region, and in which openings are provided above said photoelectric converting portions; and a second light blocking layer which is disposed on said OB pixel region, wherein said first light blocking layer and said second light blocking layer are electrically isolated from each other by an isolating region, and a voltage is applied to only said first light blocking layer.

8. A solid-state imaging device comprises:
an effective pixel region where photoelectric converting portions for obtaining an imaging signal corresponding to light from an object are disposed;
an OB pixel region having an element region for obtaining a reference signal of an optical black level;
a first light blocking layer which is disposed on said effective pixel region, and in which openings are provided above said photoelectric converting portions; and
a second light blocking layer which is disposed on said OB pixel region, wherein a terminal for applying a first voltage is connected to said first light blocking layer, and a terminal for applying a second voltage which is different from the first voltage is connected to said second light blocking layer.

9. The solid-state imaging device according to claim 7, which further comprises a light blocking section for blocking light from entering said isolating region.

10. The solid-state imaging device according to claim 7, wherein said light blocking section is a third light blocking layer which is provided above said isolating region.

11. The solid-state imaging device according to claim 10, wherein said third light blocking layer covers said isolating region, and is provided in a region which is wider than said isolating region.

12. The solid-state imaging device according to claim 7, wherein said light blocking section is an optical layer which is provided above said isolating region, and which is optically black.

13. An imaging apparatus comprising the solid-state imaging device according to claim 1.

* * * * *